(12) United States Patent
Farinelli et al.

(10) Patent No.: US 8,745,850 B2
(45) Date of Patent: Jun. 10, 2014

(54) METHOD OF MANUFACTURING SUPERCONDUCTING LOW PASS FILTER FOR QUANTUM COMPUTING

(75) Inventors: Matthew J. Farinelli, Yorktown Heights, NY (US); George A. Keefe, Yorktown Heights, NY (US); Frank Milliken, Jr., Tarrytown, NY (US); James R. Rozen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 887 days.

(21) Appl. No.: 12/642,331

(22) Filed: Dec. 18, 2009

(65) Prior Publication Data

US 2011/0152104 A1   Jun. 23, 2011

(51) Int. Cl.
*H03H 1/00* (2006.01)
*H03H 3/00* (2006.01)
*H03H 7/01* (2006.01)

(52) U.S. Cl.
USPC ............. 29/599; 29/605; 242/591; 333/168; 336/96; 336/180; 336/213

(58) Field of Classification Search
CPC ...... B82Y 10/00; G06N 99/002; H01L 39/24; H03H 1/00; H03H 3/00; H03H 7/0115; H01F 6/06
USPC .......... 29/599, 605, 606; 174/125.1; 242/591; 333/184, 168, 167, 172, 183; 336/229, 336/213, 96, 180, 170, 171; 361/821, 728
See application file for complete search history.

(56) References Cited

U.S. PATENT DOCUMENTS 5,293,524 A * 3/1994 Mookerjee et al. ........... 335/216

(Continued)

FOREIGN PATENT DOCUMENTS

| JP | 63244915 A | 10/1988 |
|----|-----------|---------|
| JP | 1015905 A2 | 1/1989 |
| JP | 1293005 A2 | 11/1989 |
| JP | 1297911 A2 | 12/1989 |

OTHER PUBLICATIONS

Lukashenko et al., "Improved powder filters for qubit measurements", Review of Science Instruments 79, 014701 (2008), published online Jan. 2, 2008.

Freund et al., "Compact low-pass electrical filters for cryogenic detectors", Rev. Sci. Instrum. vol. 66, No. 3, Mar. 1995, pp. 2638-2640.

Devincenzo et al., "The Physical Implementation of Quantum Computation", (arXiv:quant-ph/0002077 v3, Apr. 13, 2000), Fortschritte det Physik, vol. 48, May 23, 2006, pp. 771-783.

(Continued)

*Primary Examiner* — Livius R Cazan
(74) *Attorney, Agent, or Firm* — Scully, Scott, Murphy & Presser, P.C.; Daniel P. Morris, Esq.

(57) ABSTRACT

An apparatus and method for manufacturing a superconducting low-pass filter for quantum computing devices. The apparatus includes a plurality of containers and input and output ports connected to opposite ends of the apparatus. A plurality of coils of superconducting wire are wound using a mandrel. An adhesive is applied to the coils for maintaining a wound state. Each of the coils are positioned in each of the containers and electrically connected to each other with at least one coil being connected to the input port and at least one coil being connected to the output port. The coils are released or expanded from their wound state using an adhesive solvent. The containers are then filled with a conductive polymer and the containers are closed with one or more covers.

12 Claims, 5 Drawing Sheets

(56) References Cited

U.S. PATENT DOCUMENTS

| | | |
|---|---|---|
| 6,653,917 B2 | 11/2003 | Kang et al. |
| 6,710,692 B2 | 3/2004 | Kato et al. |
| 6,788,185 B2 | 9/2004 | Fujiwara et al. |
| 7,219,416 B2 | 5/2007 | Inoue et al. |
| 2002/0038720 A1* | 4/2002 | Kai et al. ............ 174/125.1 |

OTHER PUBLICATIONS

Steffen et al., "Measurement of the Entanglement of Two Superconducting Qubits via State Tomography", Science, vol. 313, Sep. 8, 2006, pp. 1423-1425.

Steffen et al., "Decoherence of floating qubits due to capacitive coupling", New Journal of Physics 11 (2009) 033030, Mar. 25, 2009.

* cited by examiner

METHOD OF MANUFACTURING SUPERCONDUCTING LOW PASS FILTER FOR QUANTUM COMPUTING

BACKGROUND

The present invention relates to fabrication of electronic filter devices for use with quantum computing devices, and more particularly, fabrication of low-pass electronic filter devices for use in cryogenic systems and quantum computing devices.

Current methods in the field of quantum computing perform quantum computations, however, the methods are not capable of meeting practical requirements of a scalable quantum computer. Devices for quantum computers may be based on superconducting Josephson junction devices, or flux qubits. Josephson junction devices are based on the Josephson effect, which is the phenomenon of current flow across two weakly coupled superconductors, separated by a very thin insulating barrier, this arrangement is known as a Josephson junction. The flux qubits include making measurements on superconducting qubit devices (cryogenic systems, high frequency electronics, etc.). A cryogenic system includes a vessel to hold a cryogen, typically helium, in a liquid state with minimal evaporation (boil-off). A shortcoming of these devices includes electronic noise caused by various sources (for example, environment, or equipment). The electronic noise must be fully suppressed, otherwise, the electronic noise can be transferred to the quantum system and lead to premature decoherence of the system. In another aspect of current systems, another problem which occurs is that cryogenic systems (dewars (containers for holding, for example, liquid nitrogen), cryostats, dilution refrigerators, etc.) have limitations in both physical size and cooling power. Thus, no active components (energy dissipating elements) can be located near the superconducting device being tested otherwise thermal dissipation negatively affects the experimental measurements. Known attempts for solving the problem of thermal dissipation include, electrical screen rooms, elimination of ground loops, coaxial/triaxial feedthroughs, low-loss device coupling and terminations, low noise electronics (power supplies, arbitrary waveform generators, pre-amplifiers, oscilloscopes, etc.), and passive and active filtering of signals from room temperature devices. However, these solutions have resulted in shortcomings because most cryostats are limited to just a few micro-watts of cooling power, thus, passive filters (RLC filter networks) near the experimental setup need to be limited in both size and number of elements due to their power dissipation.

Problems regarding quantum computing include determining the ultimate limits of computational speed and efficiency. A quantum computer, if such a device could be manufactured, would be able to solve certain computational problems exponentially faster than even the fastest classical computer. This boost in speed is a result of using quantum bits (qubits), the quantum mechanical analog to the classical bit, which possess the ability to exist not only in the classical states of |0> or |1>, but also in a superposition of those two states. In simplest terms, the qubits can be in both the |0> and |1> states simultaneously. Thus, a collection of qubits, for example, 1000 qubits, could simultaneously store all the logical combinations of $2^{1000}$ states or about $10^{300}$ parallel combinations. If a quantum computing algorithm could be devised to manipulate all thousand qubits at once and if all of these qubits can interact with one another (called entanglement), then all $10^{300}$ states can be operated on simultaneously and the results of that algorithm will yield an answer much faster than a classical computers approach of manipulated each of the $10^{300}$ states sequentially. However, this is only possible if a superposition can be maintained by all of the qubits.

The principle of superposition is strictly a quantum mechanical phenomenon and can only exist as long as the qubit is isolated from the surrounding environment. Once the qubit interacts with the outside environment, the superposition of the qubit will collapse into one of the two classical states, |1> or |0>. This phenomenon is called decoherence and all qubits, and by extension, all quantum computers, are subject to it. Decoherence time is defined as the time it takes for a qubit to collapse into one of the classical states from its quantum mechanical superposition. Depending on the type of qubit one uses (trapped ion, photons, nuclear spins, superconducting loops, etc.), decoherence times can vary from nanoseconds ($10^9$ seconds) to hundreds of microseconds ($10^6$ seconds). Thus, if the decoherence time is long enough, qubit manipulations are possible as long as the quantum computation and its associated manipulations can be completed before the qubits decohere. It is apparent that if decoherence times were the only criterion by which to design a quantum computer, then a long-lived qubit would be chosen, however, other criteria may limit the usefulness of a given qubit.

Superconducting qubits based on Josephson junctions may meet criteria for successfully making a quantum computer. Decoherence times for superconducting qubits based on Josephson junctions have been reported to be as long as a few microseconds. Successful manipulations of qubits based on superconducting Josephson junctions require not only the use of cryogenic systems (refrigerators capable of reaching milli-Kelvin temperatures) but also the design and implementation of microwave electronics (Josephson electronics typically operate at microwave frequencies, f>1 GHz). As the dimensions of the qubit, and the wiring that attaches the qubit to the outside world, begin to approach the wavelength of the associated operating frequencies, careful design and implementation of the electronics must be considered in order to not introduce noise and loss into the qubit from the outside world.

Figure 1:
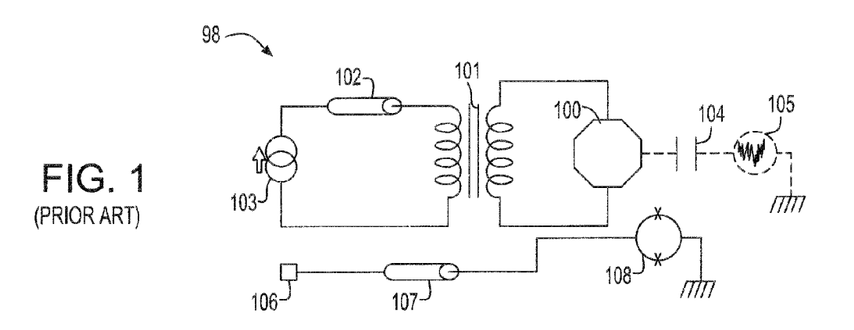
FIG. 1 is a schematic view of a prior art biasing circuit.

As shown in FIG. 1, a potential source of noise can be the electronics used to readout the state of the qubit. A known biasing circuit 98 includes elements 101, 102 and 103, and a superconducting quantum interference device (SQUID) readout circuit including elements 106, 107, and 108, and a qubit 100. Environmental noise, represented by element 105, can be capacitively coupled 104 to a qubit as well. Another potential noise source is the superconducting circuit elements that are used to bias the qubit. In both of these cases, environmental element 105 may be inductively coupled to the qubit circuit. Environmental noise, e.g., thermal current generated in normal metals, stray magnetic fields, etc., can couple into the qubit and be a source of decoherence. While electrical line noises can be filtered out and mitigated using properly designed microwave elements, environmental noise can only be reduced by engineering of the qubit structure, test apparatus and surrounding liquid Helium (He) dewar.

Passive circuit elements, such as resistors, capacitors and inductors, are known to be used as filtering elements in electronics design. The filter type designates the areas of the frequency spectrum which the elements either allow to pass unattenuated or block completely. These filter types are designated as low-pass, high-pass or band-pass filters. A perfect low-pass filter is designed to allows signals to pass unattenuated from DC (0 Hz) up to some prescribed frequency value ($f_s$) after which the electrical signal begins to roll off in strength (called cut-off). Similarly, high-pass filters are designed to allow electrical signals to pass unattenuated from some prescribed frequency ($f_p$) to, theoretically, infinity.

Band-pass filters are a combination of low-pass and high-pass filters that either block or allow a specific frequency range. Filters are designed not only based on which frequency portion of the spectrum they allow, but also by how quickly the signal is attenuated (cut-off), how large the attenuation is for the portion of the spectrum that is allowed to pass (pass-band attenuation) for the portion that is blocked (stop-band attenuation), and if there is any allowable ripple in the pass-band or stop-band. These parameters are specified for designing the appropriate passive circuit elements to produce the desired output spectrum or transfer function.

Figure 2:
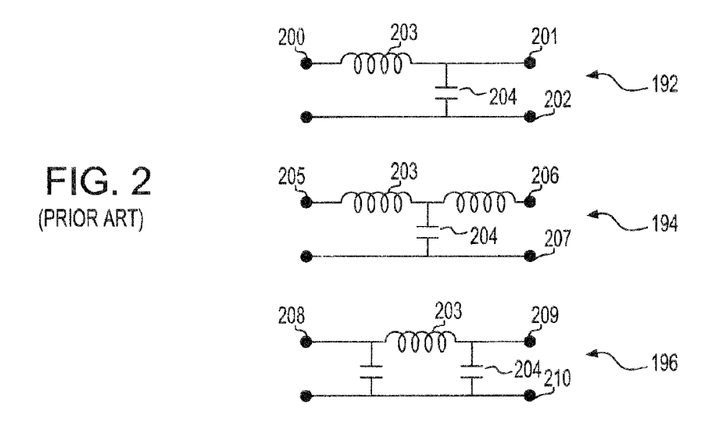
FIG. 2 is a schematic view of prior art low-pass filter networks.

FIG. 2 shows various configurations of circuit elements describe by 4-port networks. Three 4-port low-pass filter networks are shown, 192, 194, 196, the L-filter, T-filter and π-filter, respectively. Each network has an input port 200, 205 and 208, an output port 201, 206 and 209, a common port 202, 207 and 210, respectively, and passive circuit devices elements 203 and 204. The three basic 4-port networks are the L-filter, T-filter and n-filter configurations. Each configuration offers the circuit designer flexibility in creating the various types of filters. The basic elements can be "laddered" together to form filters with a wide range of frequency responses. These laddered circuit elements define different transfer functions for the filter. The transfer function of a filter is defined as the ratio of the filters output signal, usually defined as Y(s), with respect to its input signal, usually defined as $X_{(s)}$, with s being the complex frequency defined as s=σ +jω. Mathematically, the transfer function is defined as, $$H(s) = \frac{Y(s)}{X(s)}$$

and it will be the ratio of two rational polynomial functions. The order of a particular filter design is defined as the highest power polynomial found in either the numerator or denominator. The structure of the transfer function's rational polynomials determines what family of filters it belongs to with each family having specific characteristics. Examples of filter family types includes, but are not limited to, Butterworth filters, Chebychev filters (both type I and type II), Bessel filters and Elliptic filters. These filter families have specific qualities such as pass band gain and ripple, stop band ripple, cut-off and group delay. If a fast transition between the pass band and stop band is important, elliptic filters have the fastest roll-off of any electronic filter.

Because most passive circuit elements are dissipative (convert energy into heat), utilizing them in a low temperature measurement apparatus can be prohibitive if the thermal energy generated exceeds the cooling power of the low temperature refrigerator, typically less than 50 mW. The filters described above typically require the use of many passive components (>5 components), and thus achieve the necessary filter requirements within the given thermal budget of the system can be impossible.

Low temperature measurements using basic low-pass filters can be made from wires embedded in a matrix of metal powders. These filters can achieve reasonable cut-off levels because the wires will develop a self-inductance that can be enhanced by the addition of metal powders around it. Stray capacitance to ground provides the necessary reactance to achieve a desired cut-off frequency.

Figure 3:
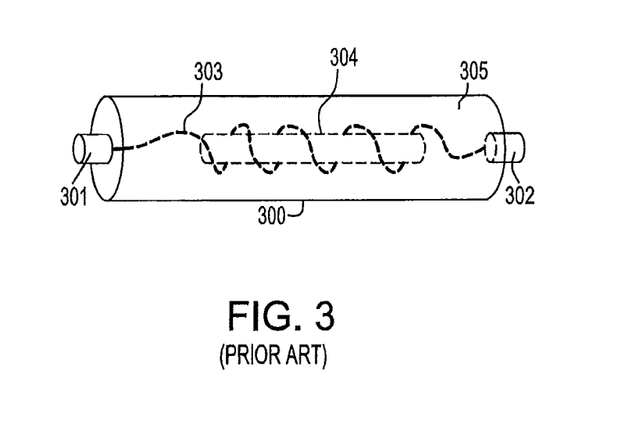
FIG. 3 is a perspective view of a prior art metal powder filter.

FIG. 3 shows a typical metal powder-filled filter. The body of the filter 300, is filled with a metal powder in some non-conducting binder 305. The input and output ports 301 and 302, respectively, are connected to one another by a conductive wire 303, that is then wound around a separate metal powder core 304. The powder core 304 and surrounding powder medium 305 can be of the same or differing compositions depending on the requirements of the filter. Metal powder-filled filters are generally constructed by creating an inductive element and encasing that element in a non-conducting binder that is filled with metal powder. The metal powder can be chosen to be either non-magnetic or ferromagnetic depending on the environmental requirements and the level of attenuation needed. Attenuation in these filters comes mainly from the metal particles absorbing high-frequency radiation and dissipating it through the generation of eddy currents. The fraction of metal powder to binder can be increased until the material mixture becomes conducting, which is the percolation threshold. At this point, there is a low conduction pathway to ground created by the metal powder particles touching one another and the outer case. The inductive element 404 (shown in FIG. 4) can either be a straight length of wire, a coil of wire or a coil of wire that is wrapped around a soft ferromagnetic core to enhance the high frequency reactance of the wire.

Figure 4:
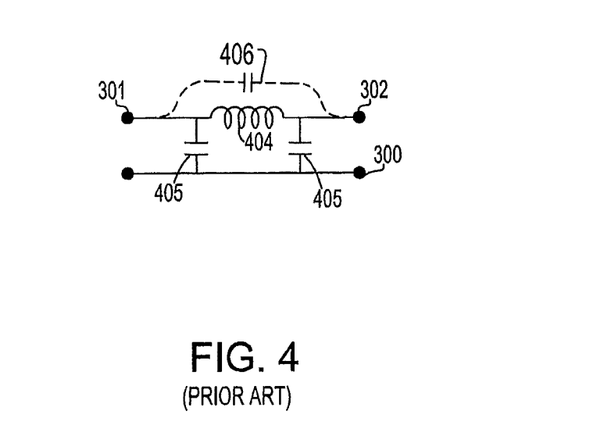
FIG. 4 is a schematic view of a prior art lumped-element circuit model of the metal powder-filled filter of FIG. 3.

The lumped circuit element model for a typical metal powder filter is shown in FIG. 4 which includes capacitors 405. The metal power filter can be designed with cut-off characteristics, however, they suffer from a parasitic capacitance 406 between the input and output ports 301, 302 if proper care is not taken to shield the connectors. This additional parasitic capacitance can provide a pathway for high frequency noise to bypass the inductive element 404, thus leading to poor stop-band performance at gigahertz frequencies (109 Hz).

It would therefore be desirable to provide a method for making compact, highly versatile, superconducting low-pass filters necessary for the electronic readout of superconducting quantum computing devices. It would further be desirable to provide a method for making superconducting low-pass filters out of discrete electronic components which are energy dissipative and not suitable for low temperature (<50 mK) measurement rigs (e.g., dilution refrigerators). It would also be desirable to provide a method for making a superconducting low-pass filter which allows for easy modification of the filter properties (cutoff frequency, transition band slope, etc.).

BRIEF SUMMARY

In an aspect of the present invention a method for manufacturing a superconducting low-pass filter for quantum computing devices includes: providing a device including a plurality of containers defining cavities therein; connecting input and output ports to opposite ends of the device; winding a plurality of coils of superconducting wire using a winding mandrel; applying adhesive to coils for maintaining a wound state; positioning a coil in each of the cavities of the containers; electrically connecting each of the coils in the containers to one another and at least one coil being connected to the input port and at least one coil being connected to the output port; releasing the coils from their wound state using an adhesive solvent; filling the cavities with a conductive polymer; and closing the containers with one or more covers.

In a related aspect, the method further includes: vacuuming each container; and degassing each container. The conductive polymer may be an epoxy and the epoxy is given a specified time period to cure. In another related aspect, each cavity may further include a solderable material. Further, the containers may include a superconducting metal. The containers may further include a material having high thermal conductivity. The method may further include expanding the wire coils and impregnating the wire coils with a mixture of ferromagnetic metal-powder filled epoxy. The method may further include loosely coiling at least one wire coil to permit contact by the conductive polymer with a greater surface area of the wire coil. The conductive polymer may be a superconductor having a low resistance to a DC current flow. The method may further include in the step of winding a plurality of coils: forming a mandrel comprising a non-stick material; positioning spacers for setting the length of a coiled basket; and winding the superconducting wire around the mandrel and between the spacers for forming the coil of wire.

In another aspect of the invention, a method of making a string of inductive elements from a single length of superconducting wire includes: forming a mandrel comprising a non-stick material; positioning spacers for setting the length of a coiled basket; and winding superconducting wire around the mandrel and between the spacers for creating a coil of wire.

In another aspect of the invention, a superconducting low-pass filter for quantum computing devices includes a device including a plurality of containers defining cavities therein. The filter further includes input and output ports are connected to opposite ends of the device. The filter includes a plurality of coils of superconducting wire wherein one of the plurality of coils are positioned in each of the cavities of the containers, and each of the coils are electrically connected in the containers to one another and at least one coil is connected to the input port and at least one coil is connected to the output port. In the filter, a conductive polymer fills the cavities, and one or more covers are positioned over the containers for sealing the containers.

In a related aspect, each container is vacuumed sealed and degassed. Each cavity may further includes a solderable material. The containers may further include a superconducting metal. The containers may also include a material having high thermal conductivity. The wire coils may be impregnated with a mixture of ferromagnetic metal-powder filled epoxy.

In another aspect of the invention, a superconducting low-pass filter for quantum computing devices is manufactured by a process including: providing a device including a plurality of containers defining cavities therein; connecting input and output ports to opposite ends of the device; winding a plurality of coils of superconducting wire using a winding mandrel, including the steps of: positioning spacers for setting the length of a coiled basket; and winding the superconducting wire around the mandrel and between the spacers for forming the coils of wire; the process further including: expanding the wire coils and impregnating the wire coils with a mixture of ferromagnetic metal-powder filled epoxy; applying adhesive to coils for maintaining a wound state; positioning a coil in each of the cavities of the containers; electrically connecting each of the coils in the containers to one another and at least one coil being connected to the input port and at least one coil being connected to the output port; releasing the coils from their wound state using an adhesive solvent; filling the cavities with a conductive polymer; and closing the containers with one or more covers.

In a related aspect, the manufacturing process further includes the step of loosely coiling at least one wire coil to permit contact by the conductive polymer with a greater surface area of the wire coil.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings, in which.

DETAILED DESCRIPTION

Figure 5:
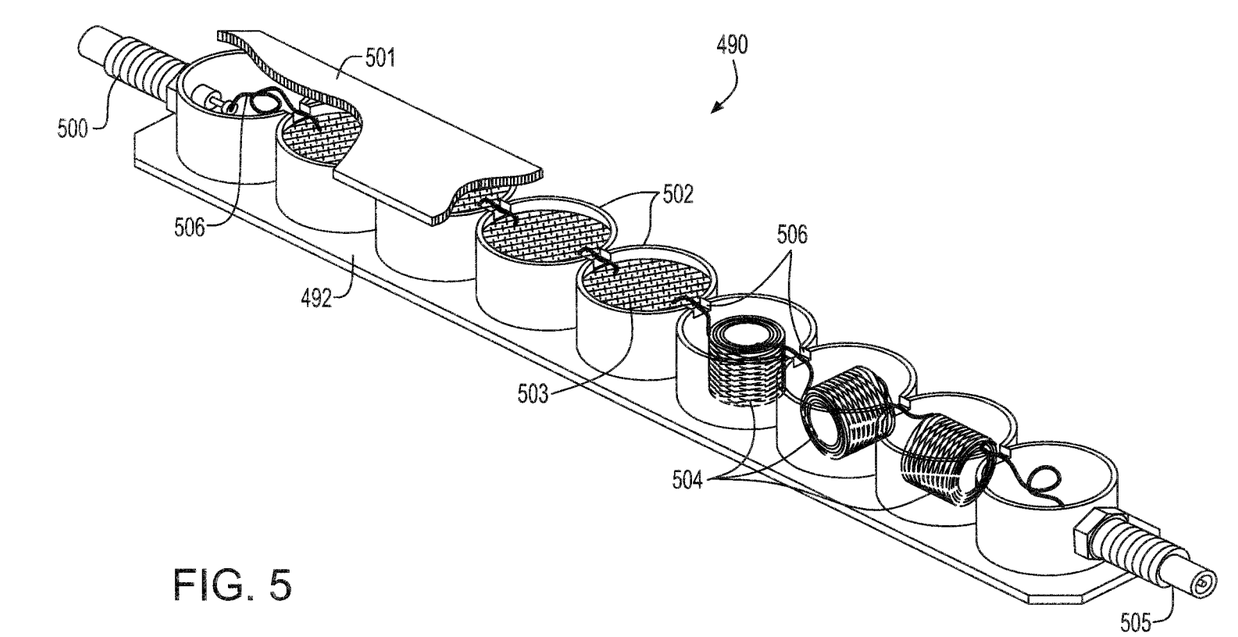
FIG. 5 is a perspective view of an embodiment according to the present invention of a filter assembly.
Figure 6:
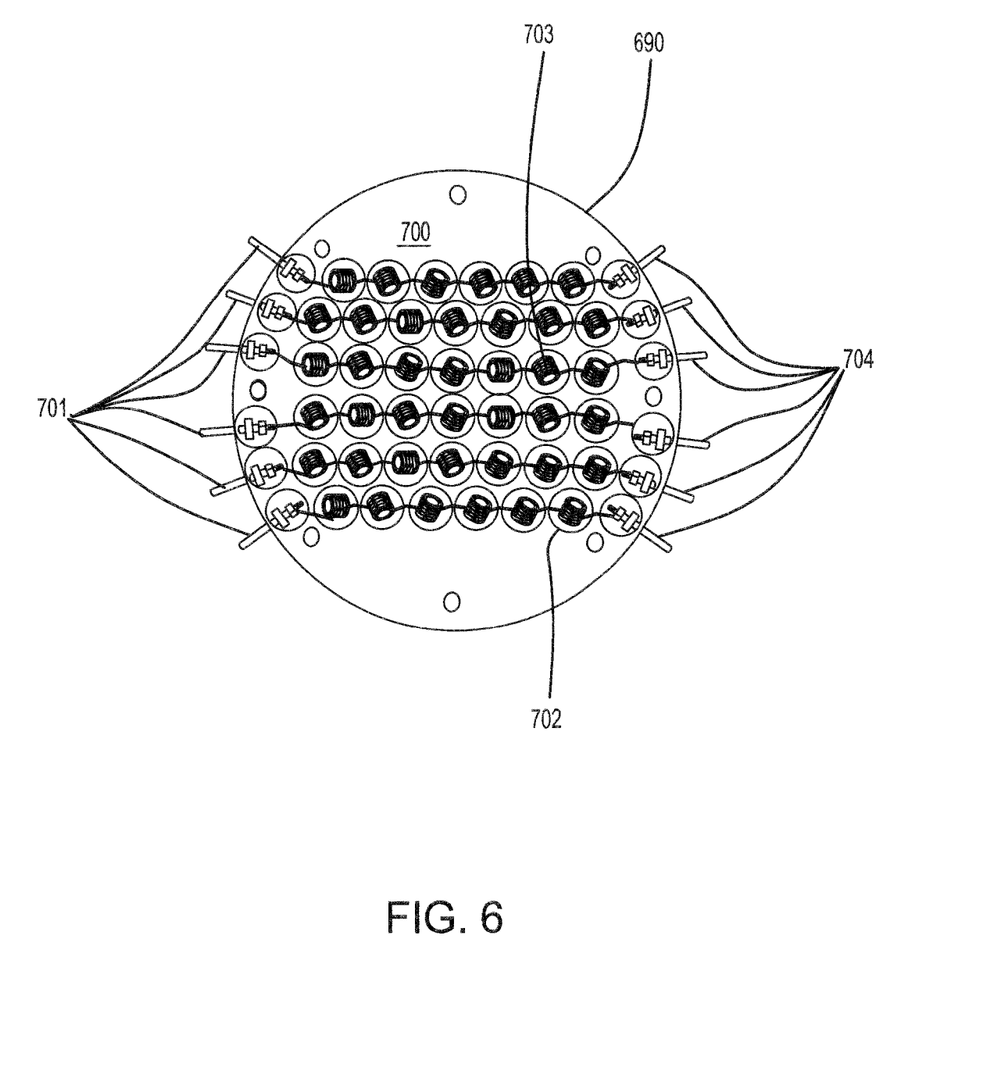
FIG. 6 is a plan view of a filter assembly according to another embodiment of the invention.

In an illustrative embodiment of the present invention, an apparatus and method of constructing a low-pass filter is provided using superconductive wire coils and metallic powder and a conductive polymer inner filler, embodied as epoxy. Referring to FIGS. 5 and 6, includes a filter assembly 490 which includes containers 502 (or wells) on a support element 492, and a cover 501 extending over the containers 502. The container 502 provides an electrical ground. The filter 490 further includes an input port 500 and an output port 505 at opposite ends of the filter 490. The containers 502 include inductive elements 504, and are potted in the container 502 in a metal powder-filled medium 503. Connection leads 506 connect the input and output ports 500, 505, respectively to the inductive elements 504 and connect the inductive elements 504 to each other.

Because of the modular nature of the present invention, various configurations (linear, angled, area, etc.) of the filters can be implemented. Once a configuration is chosen, for example, a linear array of inductive elements, the containers can be machined from stock materials. An exemplary design might consist of nine cans machined out of brass along with a base and cover. Materials used to make the physical containers, cans and covers, can be, for example, either a material with good thermal conductivity, such as brass or copper, or a superconducting material, such as aluminum and its alloys, niobium or niobium-titanium alloys. The terminal cans of the filter are fitted with an appropriate high frequency connector, for example, SMA (Subminiature Version A) connectors.

Referring to FIG. 6, another embodiment of a low-pass filter 690 includes cavities 702 formed in a plate 700. The cavities are machined to hold a preformed coil of wire 703. The coil of wire 703 is expanded (at a specified time in the process), after which, the cavity 702 is filled with a metal powder/epoxy mixture (not shown). The coils 703 are pre-wound to fit in a specified number of cavities 702 and are connected to the input and output ports 701 and 704, respectively. The plate 700 can be machined to a size and shape as specified.

Figure 7:
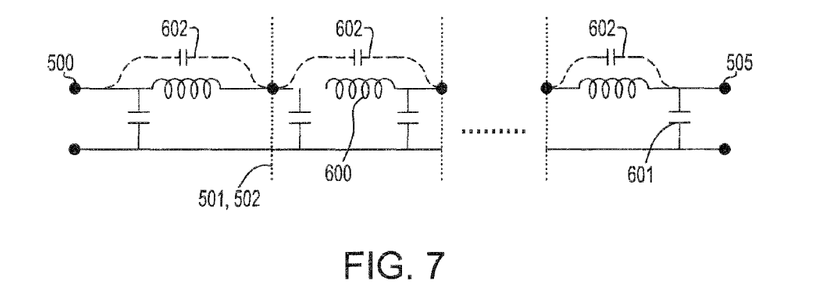
FIG. 7 is a schematic view of another lump-element circuit model according to another embodiment of the invention.

Referring to FIG. 7, a lump-element circuit model 590 of an embodiment of the invention includes input and output ports 500 and 505, respectively, and capacitors 601. The ports 500 and 505 are physically isolated from one another, thereby reducing the stray capacitance 602 that could develop if each inductor 600 were not separated.

Figure 8:
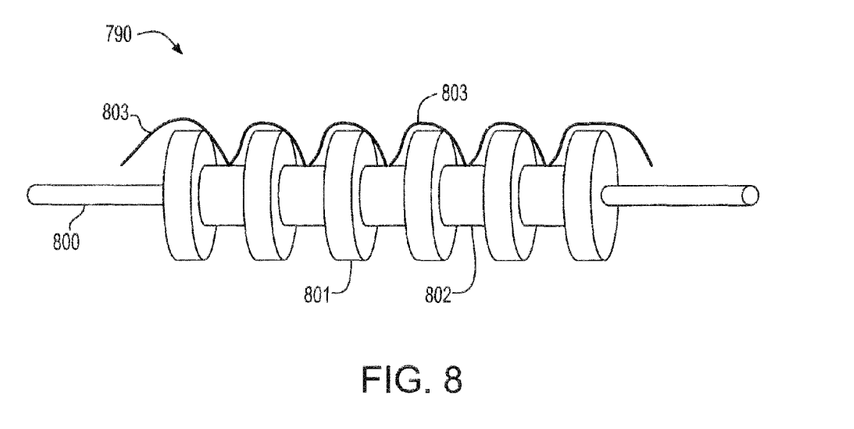
FIG. 8 is a perspective view of an apparatus according to an embodiment of the invention for making wire basket coils.

Referring to FIG. 8, an embodiment of a winding mandrel 790 is shown and a method for making wire basket-coils (or wire coils) which are the inductive elements 504 (FIG. 5) and 703 (FIG. 6). A shaft 800 has several spacers 801, spaced equally along the shaft 800. The number of spacers 801 is dictated by the number of cavities to fill in the filter apparatus 490, 690 FIGS. 5 and 6, respectively. A wire 803, used to form the inductive elements 802 of the filter assembly, is tied down at one end and the shaft 800 is slowly rotated. The coils or inductive elements 802 are individually formed in a basket-weave fashion. Once the coils 802 are temporarily set, for example with varnish, they can be removed from the winding mandrel 790 and loaded into the filter assembly, for example, filter assembly 490.

A winding mandrel 790 is constructed from a non-stick material, such as poly-tetrafluroethane (PTFE), where the center shaft 800 is segmented by spacer elements. These spacer elements are set apart at a distance that determines the overall length of the basket-coil. The mandrel 790 may be fixed into a rotating chuck, for example, in a mechanical lathe or drill press, one end of the wire 803 used to make the basket-coil is fixed to the shaft 800 and the shaft is slowly rotated. As the shaft 800 of the mandrel 790 rotates, the wire is coiled in the first segment in a basket-weave fashion. This is achieved by holding the wire at an acute angle to the shaft direction and alternating angle direction as the wire 803 coils itself up and down the shaft 800. The coiling process is subject to specifications, as the open weave structure will be expanded at a later time in the process to allow maximum penetration of the metal particle/epoxy mixture around the wire. The wire used to make the coils is typically a superconducting material, for example, copper-clad niobium-titanium alloy wire, however, other conductive material may be used. Once the first inductive element is completed, the wire 803 is glued down to a point on the spacer 801 and temporarily fixed in place. The same process is repeated for each segment on the mandrel 790 until all segments contain a basket-weave coil. Finally, in order to temporarily keep the wire coils in their shape for removal from the mandrel, a dissolvable, low-viscosity fixative compound is applied to each coil, for example, varnish or lacquer. Once the fixative compound dries, the coils can be separated from the mandrel 790 and placed into the cavities of the filter, for example, cavities of containers 502 in filter apparatus 490 and cavities 702 of plate 700.

After the cavities of the filter are filled with coils, the wire segments connecting the coils together are fixed in place using low temperature glue. The entire assembly is then placed into a solvent bath to allow the varnish to dissolve and the coiled baskets to expand in place. Once the coils are fully expanded, the entire assembly is removed from the solvent bath, dried and each cavity is filled with the metal powder/epoxy mixture. An exemplary filling material for the cavity is a mixture metal powder, for example, iron or bronze particles with an average particle size of 20 μm or less, or an epoxy apportioned as 82 weight-percent metal to 18 weight-percent epoxy. The ratio of metal particles to epoxy will directly affect the attenuation properties of the filter. After each container is filled, the epoxy mixture is vacuum degassed to eliminate trapped air bubbles and the containers 502 are closed with the metal cover 501 using a conductive adhesive (FIG. 5). The epoxy then cures for the time specified by the manufacturer, for example, 24 hours. After the assembly is complete, the device can be tested using a standard high frequency spectrum analyzer.

The method of the present invention provides compact, highly versatile, superconducting low-pass filters necessary for the electronic readout of superconducting quantum computing devices. The present invention, for example, filter assembly 490 (FIG. 5), replaces the need for making these filters out of discrete electronic components which are energy dissipative and not suitable for low temperature (<50 mK) measurement rigs (e.g., dilution refrigerators).

The superconducting low-pass filter 490 (FIG. 5) is a compact implementation of an elliptic filter that enables very high attenuation with low power dissipation. The unique design process for making this filter allows for easy modification of the filter properties (cutoff frequency, transition band slope, etc.).

Advantages of the filter assembly of the present invention includes, eliminating dissipative loads or loss due to Cu/Nb—Ti wiring, i.e., no heat dissipation, no Johnson noise due to the use of superconducting wire, sharp transition edge of filter characteristics (>100 dB/decade), extremely good stop-band performance from metal powder fill and long wire lengths (attn>−100 dB overall), simple package & modular design allows for placement inside cryostat near experimental setup and a very low cutoff frequency for given package size. Additionally, the method of creating the filter assembly 490 (FIG. 5) provides for easy modification of the filter properties (cutoff frequency, transition band slope, etc.

In one embodiment, the method includes machining containers 502 to a specified size and quantity for filter design. Next, the containers 502 are assembled in a row as shown in FIG. 5 with specified outer ports 500, 505 at opposite ends thereof. The containers 502 and cover 501 (FIG. 5) may be composed of, for example, brass or a superconducting material (Al or Nb). Next, superconducting wire (for example, Cu-clad Niobium-Titanium wire) is wound on the mandrel 790 in an open basket-weave fashion and temporarily affixed with varnish. After the varnish has dried, each wire basket 504 is slid off the mandrel 790 and placed in a container 502. Next, the wire baskets 504 in the containers 502 are expanded or released by dissolving the varnish using alcohol solvent. The alcohol evaporates, and each container 502 is filled about half way with epoxy/metal powder fill, for example, 20 micron diameter Kennametals bronze (copper/tin alloy) powder. The epoxy mixture is vacuumed and degassed. The open weave of basket-wound coils 504 allows full contact along the entire wire length and metal powder/epoxy mixture. Each container 502 is filled with more epoxy, vacuumed, degassed, and closed with the cover 501 using conductive adhesive (FIG. 5). The epoxy cures within about 24 hours, and the filter assembly is ready for use.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for manufacturing a superconducting low-pass filter for quantum computing devices, comprising:
   providing a device including a plurality of containers defining cavities therein;
   connecting input and output ports to opposite ends of the device;
   winding a plurality of coils of superconducting wire using a winding mandrel;
   applying adhesive to coils for maintaining a wound state;
   positioning a coil in each of the cavities of the containers;
   electrically connecting each of the coils in the containers to one another and at least one coil being connected to the input port and at least one coil being connected to the output port;

releasing the coils from their wound state using an adhesive solvent;
filling the cavities with a conductive polymer; and
closing the containers with one or more covers.

2. The method of claim 1, further comprising:
vacuuming each container; and
degassing each container.

3. The method of claim 1, wherein the conductive polymer is an epoxy.

4. The method of claim 1, wherein the epoxy is given a specified time period to cure.

5. The method of claim 1, wherein each cavity further includes a solderable material.

6. The method of claim 1, wherein the containers include a superconducting metal.

7. The method of claim 1, wherein the containers include a material having high thermal conductivity.

8. The method of claim 1, further comprising:
expanding the wire coils and impregnating the wire coils with a mixture of ferromagnetic metal-powder filled epoxy.

9. The method of claim 1, further comprising:
loosely coiling at least one wire coil to permit contact by the conductive polymer with a greater surface area of the wire coil.

10. The method of claim 1, wherein the conductive polymer is a superconductor having a low resistance to a DC current flow.

11. The method of claim 1, wherein the step of winding a plurality of coils further comprises:
forming a mandrel comprising a non-stick material;
positioning spacers for setting the length of a coiled basket; and
winding the superconducting wire around the mandrel and between the spacers for forming the coil of wire.

12. A method of making a string of inductive elements from a single length of superconducting wire, comprising:
forming a mandrel comprising a non-stick material, said mandrel comprising a center shaft;
positioning spacer elements about said central shaft, segmenting it, a distance between two adjacent spacer elements for setting the length of a coiled basket; and
winding superconducting wire around the mandrel and between the spacers for creating a coil of wire, said winding including:
fixing the mandrel into a rotating chuck;
fixing one end of the superconducting wire to the central shaft;
rotating the central shaft wherein the superconducting wire is coiled in a first segment in a basket-weave fashion; and
after coiling in the first segment, temporarily affixing the wire to a spacer, and rotating the central shaft to form a superconducting wire coiled basket in the next segment;
repeating said temporarily affixing of said superconducting wire to a spacer and rotating steps to form said coiled basket in each successive segment on the mandrel until all segments contain a basket-weave coil.

\* \* \* \* \*